(12) United States Patent
Bertl

(10) Patent No.: US 11,984,875 B2
(45) Date of Patent: May 14, 2024

(54) RADIO FREQUENCY MULTIPLEXER

(71) Applicant: RF360 SINGAPORE PTE. LTD., Singapore (SG)

(72) Inventor: Sebastian Bertl, Ampermoching (DE)

(73) Assignee: RF360 Singapore Pte. Ltd., Singapore (SG)

( * ) Notice: Subject to any disclaimer, the term of this patent is extended or adjusted under 35 U.S.C. 154(b) by 707 days.

(21) Appl. No.: 17/054,693

(22) PCT Filed: May 3, 2019

(86) PCT No.: PCT/EP2019/061436
§ 371 (c)(1),
(2) Date: Nov. 11, 2020

(87) PCT Pub. No.: WO2019/219412
PCT Pub. Date: Nov. 21, 2019

(65) Prior Publication Data
US 2021/0083654 A1   Mar. 18, 2021

(30) Foreign Application Priority Data
May 14, 2018   (DE) .......................... 102018111428.1

(51) Int. Cl.
*H03H 9/02* (2006.01)
*H03H 9/145* (2006.01)
*H03H 9/25* (2006.01)
*H03H 9/64* (2006.01)
*H03H 9/72* (2006.01)

(52) U.S. Cl.
CPC .......... *H03H 9/72* (2013.01); *H03H 9/02543* (2013.01); *H03H 9/145* (2013.01); *H03H 9/25* (2013.01); *H03H 9/6483* (2013.01)

(58) Field of Classification Search
None
See application file for complete search history.

(56) References Cited

U.S. PATENT DOCUMENTS 6,445,261 B1   9/2002   Yuda et al.
8,916,407 B1   12/2014  Grosjean et al.
(Continued)

FOREIGN PATENT DOCUMENTS

CN      1945987 A    4/2007
CN    101017839 A    8/2007
(Continued)

OTHER PUBLICATIONS

Hu N., et al., "Temperature Compensated Piezoelectric Bulk Acoustic Wave Filters", China Excellent Master's Theses Full-text Database, May 15, 2013, 63 Pages.
(Continued)

Primary Examiner — Kenneth B Wells
(74) Attorney, Agent, or Firm — Patterson + Sheridan LLP

(57) ABSTRACT

A radio frequency multiplexer comprises send and receive circuits each including a RF filter circuit. The send and receive circuits are coupled to an antenna port and corresponding send and receive ports. A portion of the send circuit and a portion of the receive circuit are disposed on a single die. The layer stacks of the resonators of the send and receive circuits disposed on the single die can be optimized for the required functionality.

13 Claims, 4 Drawing Sheets

(56) References Cited

U.S. PATENT DOCUMENTS

| 9,860,006 B1* | 1/2018 | Okuda .................... G06F 13/22 |
| 2005/0073375 A1 | 4/2005 | Sul et al. |
| 2014/0368296 A1 | 12/2014 | Nishizawa |
| 2016/0191015 A1 | 6/2016 | Ivira et al. |

FOREIGN PATENT DOCUMENTS

| CN | 101212211 A | 7/2008 |
| CN | 101796722 A | 8/2010 |
| CN | 103444080 A | 12/2013 |
| CN | 106664068 A | 5/2017 |
| WO | 2013/097794 A1 | 7/2013 |
| WO | 2018/080900 A1 | 5/2018 |

OTHER PUBLICATIONS

Hickernell et al., "The surface acoustic wave propagation characteristics of 41/spl deg/ lithium niobate with thin-film Si0/sub 2/", Frequency Control Symposium, 1996. 50th., Procedings of the 1996 IEEE International, Jun. 5, 1996, pp. 216-221, XP010200067.

International Search Report and Written Opinion dated Aug. 13, 2019, corresponding to Application No. PCT/EP2019/061436.

* cited by examiner

RADIO FREQUENCY MULTIPLEXER

CROSS-REFERENCE TO RELATED APPLICATIONS

This application is a national stage application under 35 U.S.C. 371 of PCT/EP2019/061436, filed May 3, 2019, which claims the benefit of German Application No. 102018111428.1, filed May 14, 2018, both of which are incorporated herein by reference in their entireties.

TECHNICAL FIELD

The present disclosure relates to a radio frequency multiplexer. Specifically, the present disclosure relates to a radio frequency (RF) multiplexer circuit that comprises send and receive circuits each including a RF filter.

BACKGROUND

Radio frequency (RF) multiplexers are used in electronic communication systems at the antenna frontend to couple the send and receive paths to the antenna. The send and receive paths include RF filters to select the wanted bandwidth from the antenna signal or provide the RF signal to the antenna. Resonators are used to set up the filters. A duplexer connects one send and one receive path to the antenna port while a higher order multiplexer such as a quadplexer couples multiple send and receive paths to the antenna port.

In conventional RF multiplexers, the resonators that form the RF send (Tx) and receive (Rx) filters are realized on separate chips. Usually, one chip includes all the resonators for the Tx filter and another chip includes all the resonators for the Rx filter. Although different resonators in a filter fulfill different electrical sub-functions, they are fabricated with the same fabrication process so that it is difficult to optimize them for a specific function. For example, the resonators of the Tx filter close to the input port may have restrictions for skirt steepness and spurious modes in the frequency bands of the other carrier aggregation bands while the resonators close to the antenna port must provide a high reflection in the counter band frequency regions. These requirements limit the design flexibility for the resonators when all the resonators of one filter path of a multiplexer are realized on one chip, as is commonly the case.

There is a desire to have more flexibility in the design of a multiplexer circuit and improve the performance of the filters in a RF multiplexer.

It is an object of the present disclosure to provide a radio frequency multiplexer circuit that exhibits improved performance.

It is another object of the present disclosure to provide a RF multiplexer circuit that has improved power durability in connection with improved reflection in counter band frequency ranges.

SUMMARY

According to the present disclosure, one or more of the above-mentioned objects are achieved by a radio frequency multiplexer that comprises a send circuit and a receive circuit each comprising a RF filter circuit; a first port to be coupled to an antenna, the send circuit and the receive circuit coupled to the first port; a second port coupled to the send circuit; a third port coupled to the receive circuit; a portion of the send circuit and a portion of the receive circuit disposed on a single monocrystalline substrate.

According to the present disclosure, a portion of the send circuit and a portion of the receive circuit are disposed on a single die. Accordingly, portions of two different filter paths of a multiplexer share the same single die. This is different to conventional solutions where one die is limited to one filter path, send (Tx) or receive (Rx). The single die may be a monocrystalline substrate on which the portions of send and receive circuits are realized. The layer stacks that realize the resonators of the send and receive circuits are the same within one die, because the resonators on one die are fabricated simultaneously using the same process steps such as depositing, structuring, etc. Sharing the same single die for send and receive circuits allows that resonators having a corresponding functionality in different filters can be manufactured together. The layer stack of the resonators can be optimized for the required functionality.

Improved performance of the overall multiplexer function can be expected with this approach. For example, filter skirts with strong requirements on steepness and low temperature coefficient, on the one hand, and resonators directly at the antenna node requiring high reflection in counter band frequency ranges, on the other hand, can be realized on different dies. The layer stacks on different dies can be optimized for the different functionalities. For example, thicknesses of metal or dielectric layers within the layer stacks can be optimized for high skirt steepness and low temperature coefficient or, alternatively, high counter band reflection. The skilled person has experience from conventional designs on how to optimize the layer stacks for the required functionality.

The send and receive circuits in a multiplexer each comprise a multitude of resonators, such as surface acoustic wave (SAW) resonators or bulk acoustic wave (BAW) resonators. According to the principles of the present disclosure, at least one resonator of the send circuit and at least one resonator of the receive circuit are disposed on the same single die. If the filter path is realized with SAW resonators, the single die is a monocrystalline piezoelectric substrate on which the SAW resonators are formed. All the resonators on the same single die share the common and same monocrystalline substrate. The monocrystalline piezoelectric substrate may be lithium niobate or lithium tantalate or any other piezoelectric substrate useful to form a SAW resonator. If the filter is realized with BAW resonators, the monocrystalline substrate may be monocrystalline silicon on which the layer stack of the BAW resonator is formed.

The resonators coupled to the antenna port of the Tx filter and of the Rx filter may be realized on the same single die. This allows the optimization of the layer stack to achieve a high reflection in the counter bands which are outside the passband of the corresponding filters. This is especially useful in carrier aggregation filter systems of the 4G (LTE) communication standard.

The send filter and the receive filter may comprise a series path of resonators including one or more series connected resonators. The series connected resonator of the Tx filter and the series connected resonators of the Rx filter coupled to the antenna port are realized on the same die. The Tx filter may also comprise one or more parallel paths connected to the series path that may be also disposed on the single die together with the series resonators close to the antenna port. Accordingly, the parallel connected Tx resonators exhibit the same layer stack as the resonators at the antenna port. This layer stack may be optimized for high reflection in counter band frequency regions. Additional series connected resonators of the Tx filter, such as the resonators of the serial path of the Tx filter close to the input port of the Tx filter, can be realized on a separate die so that they can be optimized for steep filter skirts and high power durability. Steep filter skirts and high power durability usually require a low temperature coefficient so that the heat generated by the power dissipation of the Tx filter does not shift the resonance frequency. A high reflection in the counter bands, however, is usually contradictory to a low temperature coefficient and high power durability so that counter band reflection can be optimized with the layer stack of the resonators coupled to the antenna. As a result, the series resonators connected to the Tx input port are realized on a die separate from the resonators connected to the antenna port wherein the latter share resonators from the Tx filter and the Rx filter. The layer stacks of both dies are optimized for a different functionality, which is power durability, high skirt steepness and low temperature coefficient, on the one hand, and high reflection in counter bands, on the other hand. Specifically, the temperature coefficient for resonators connected to the antenna port sharing the same die is higher than the temperature coefficient of resonators connected to the Tx input port sharing another die.

The principles of the present disclosure may be employed with a duplexer circuit or with more complex multiplexer circuits such as quadplexers or even higher order multiplexers. For example, a quadplexer may include two Tx ports and two Rx ports combining the send and receive signals at one antenna port. The resonators coupled to the antenna port of at least one Tx and one Rx filter or of the two Tx and the two Rx filters may be realized on one single die. The series resonators of the two Tx ports may be realized on another die. The layer stacks of the resonators of the two separate dies may be optimized for different functionality. The first die may also include the parallel connected resonators of the Tx filters. Other elements from the Rx filters may also be realized on the first die. Specifically, series resonators close to the respective Tx ports of different Tx paths are realized on the same single die. Furthermore, other resonators of Tx and Rx paths are realized on another but single die. Advantageously, the layer stacks of resonators of different Tx or Rx paths can be optimized for the same functionality. The number of elements and the size of the circuit is substantially the same as in conventional solutions where different Tx or Rx filters are realized on different dies.

According to an embodiment, the layer stack of a SAW resonator is covered with a dielectric layer such as silicon dioxide. The thickness of the dielectric layer can be traded off between power durability and low temperature coefficient versus high reflection in counter bands. Larger thickness of the dielectric layer accounts for high power durability and low temperature coefficient. However, the relatively thick dielectric layer can be also acoustically excited so that the reflection may be low. The resonators on the die optimized for high power durability and low temperature coefficient, such as the resonators close to a Tx input port, may include a thick dielectric layer such as a thick silicon dioxide layer. The silicon dioxide layer may have a thickness in the range of about 800 nanometers (nm). On the other hand, the dielectric layer of the resonators coupled to the antenna port may be optimized for lower reflection in counter bands, sacrificing the power durability and the low temperature coefficient. In this case the dielectric layer is substantially thinner and may have a thickness in the range of about 400 nanometers (nm). The dielectric layer for resonators exhibiting high power durability and low temperature coefficient may be twice as thick as a dielectric layer for resonators exhibiting low reflection in counter band frequencies.

The principles of the present disclosure may also apply to BAW resonators disposed on the same die wherein a piezoelectric substrate such as aluminum nitride is sandwiched between two metal electrodes. A reflection arrangement such as a Bragg mirror may be disposed between the common substrate and the bottom electrode. All resonators from the same single die have the same layer stack with layers having the same thicknesses across different BAW resonators disposed on the same die. In this case the monocrystalline substrate may be monocrystalline silicon.

It is to be understood that both the foregoing general description and the following detailed description are merely exemplary, and are intended to provide an overview or framework to understand the nature and character of the claims. The accompanying drawings are included to provide a further understanding and are incorporated in, and constitute a part of, this description. The drawings illustrate one or more embodiments, and together with the description serve to explain principles and operation of the various embodiments.

The same elements in different figures of the drawings are denoted by the same reference signs.

DETAILED DESCRIPTION

The present disclosure will now be described more fully hereinafter with reference to the accompanying drawings showing embodiments of the disclosure. The disclosure may, however, be embodied in many different forms and should not be construed as limited to the embodiments set forth herein. Rather, these embodiments are provided so that the disclosure will fully convey the scope of the disclosure to those skilled in the art. The drawings are not necessarily drawn to scale but are configured to clearly illustrate the disclosure.

Figure 1:
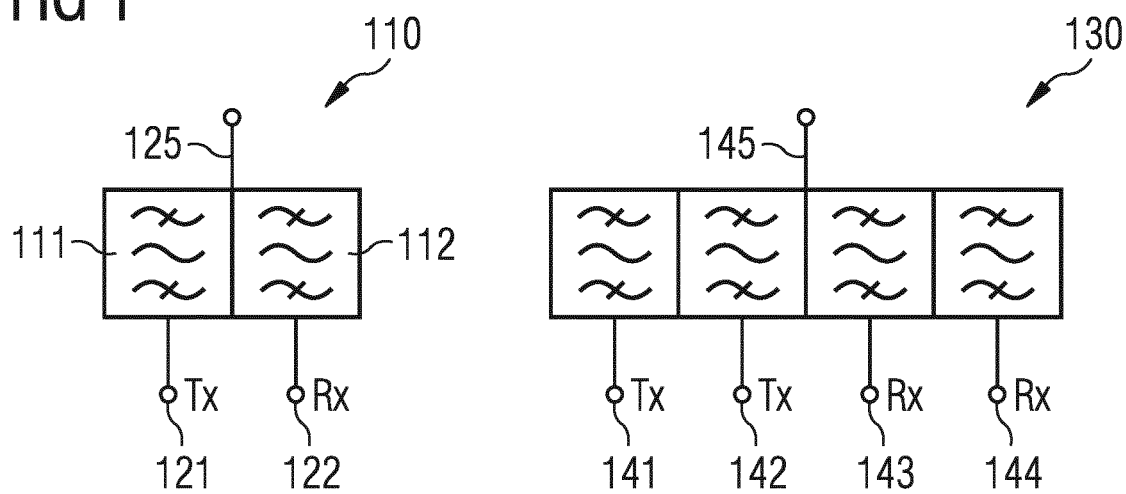
FIG. 1 shows a conventional realization of a duplexer and a quadplexer.

FIG. 1 shows the realization of a conventional duplexer and a conventional quadplexer. The duplexer 110 comprises a port 125 that is to be connected to an antenna. An input port 121 is supplied with the to be transmitted signal (Tx), and port 122 provides the filtered, received signal (Rx). Filters 111, 112 are disposed between antenna terminal 125 and Tx, Rx terminals 121, 122. According to conventional principles, the filter 111 is realized with several resonators, e.g., surface acoustic wave (SAW) resonators which are all realized and disposed on one chip. The resonators of Tx-filter 111 share the same monocrystalline piezoelectric substrate on which the layers of the resonators are disposed. In a similar way, the Rx-filter 112 comprises several SAW resonators which are all disposed on the same die. Tx- and Rx-filters 111, 112 are disposed on two separate dies or chips.

Quadplexer 130 comprises an antenna port 145 and two Tx send ports 141, 142 as well as two Rx receive ports 143, 144. The corresponding filters associated with Tx/Rx ports 141, . . . , 144 are each realized on separate, individual chips. No resonator from a Tx or Rx filter is realized on the chip of another Rx or Tx filter, respectively.

Figure 2:
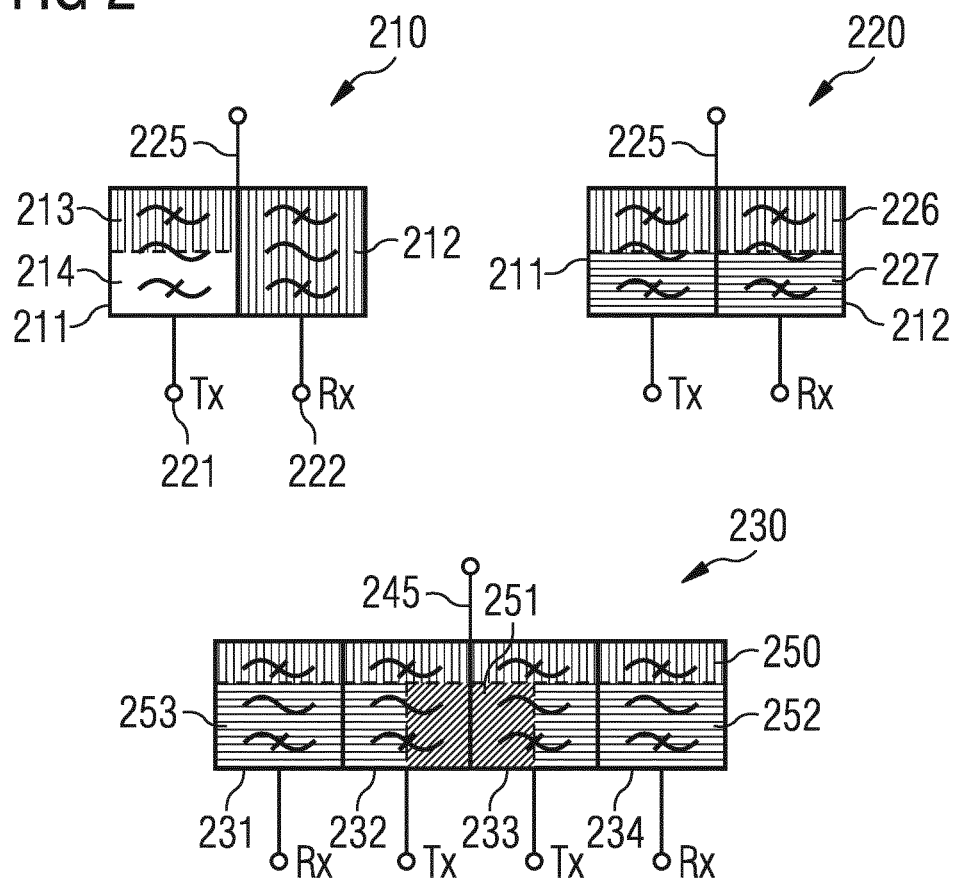
FIG. 2 shows two possible realizations of a duplexer and a realization of a quadplexer according to the principles of the present disclosure.

FIG. 2 shows two possible realizations of RF duplexers and a realization of an RF quadplexer according to embodiments of the present disclosure. The duplexer 210 comprises antenna port 225, Tx port 221 and Rx port 222. The Rx filter 212 comprises several resonators that are all disposed on one chip. Tx filter 211 comprises several resonators of which a first portion of resonators 213 is disposed on the same chip as Rx filter 212. The other portion of resonators 214 of Tx filter 211 is disposed on a second, separate chip. The chips 213, 214 are mounted on a laminate that may comprise a polymer substrate including one or more layers of metallic wires to provide electrical conductivity.

The duplexer 220 shows another partitioning of the resonators within the Tx and Rx filters. A first portion of the resonators of the Tx and Rx filters 211, 212 is realized on a first chip 226. The corresponding resonators are coupled to the antenna port so that their layer stack can be optimized to the electrical requirements useful for antenna coupled resonators. A second portion of resonators is realized on a second chip 227 so that the layer stack can be optimized to comply with other electrical requirements. For example, the layer stack of the resonators on chip 227 can be optimized to comply with requirements for the Tx portion of the duplexer.

The quadplexer 230 shows yet another partitioning of the resonators within the filters of the quadplexer. Quadplexer 230 comprises four filters for four bands which are Tx filters 232, 233 and Rx filters 231, 234. The resonators of all four filters coupled to the antenna port 245 are realized on one single chip 250. Chip 250 comprises the resonators of four different bands and four different filters coupled to the antenna port 245. A second chip 253 comprises the remainder of resonators of the Rx filter 231 and a portion of the resonators of Tx filter 232. Another chip 252 comprises the remainder of resonators of Rx filter 234 and a portion of the resonators of Tx filter 233. Yet another chip 251 comprises a portion of the resonators of the Tx filters 232, 233.

The allocation of resonators to corresponding chips depends on functionality. Resonators that perform a similar function in different filters may be allocated on the same chip so that they can be manufactured with the same layer stack. Practically, the sequence of layers and the thicknesses of the layers are the same for the resonators realized on the same chip. Therefore, the corresponding layer stacks can be optimized for the desired function. With respect to duplexer 210, the resonators of chip 214 may be manufactured with a layer stack that is adapted to handle high transmission power which is input to the Tx filter at terminal 221. The chip 227 of duplexer 220 may be manufactured with a layer stack that is optimized to handle inner skirts of the Tx and Rx filters with low temperature coefficient and outer portions with a larger distance of poles and zero positions. Chip 250 of quadplexer 230 may be manufactured with a layer stack that exhibits good reflection in counter band regions which is useful for the resonators coupled to the antenna node. Chip 251 may comprise a layer stack that causes the inner skirts of directly adjacent filters having a small temperature coefficient and a small distance between poles and zero positions. Chip 252 comprises a layer stack that is useful to realize resonators that achieve the required bandwidth. The layer stack of chip 252 is useful for resonators that have a less critical function so that they may be manufactured with a moderate layer stack that has good general electrical characteristics to provide the required bandwidth. Overall, the allocation of resonators to corresponding chips considers the electrical function that is realized by the resonators rather than the allocation to specific filter passbands according to conventional solutions.

Figure 3:
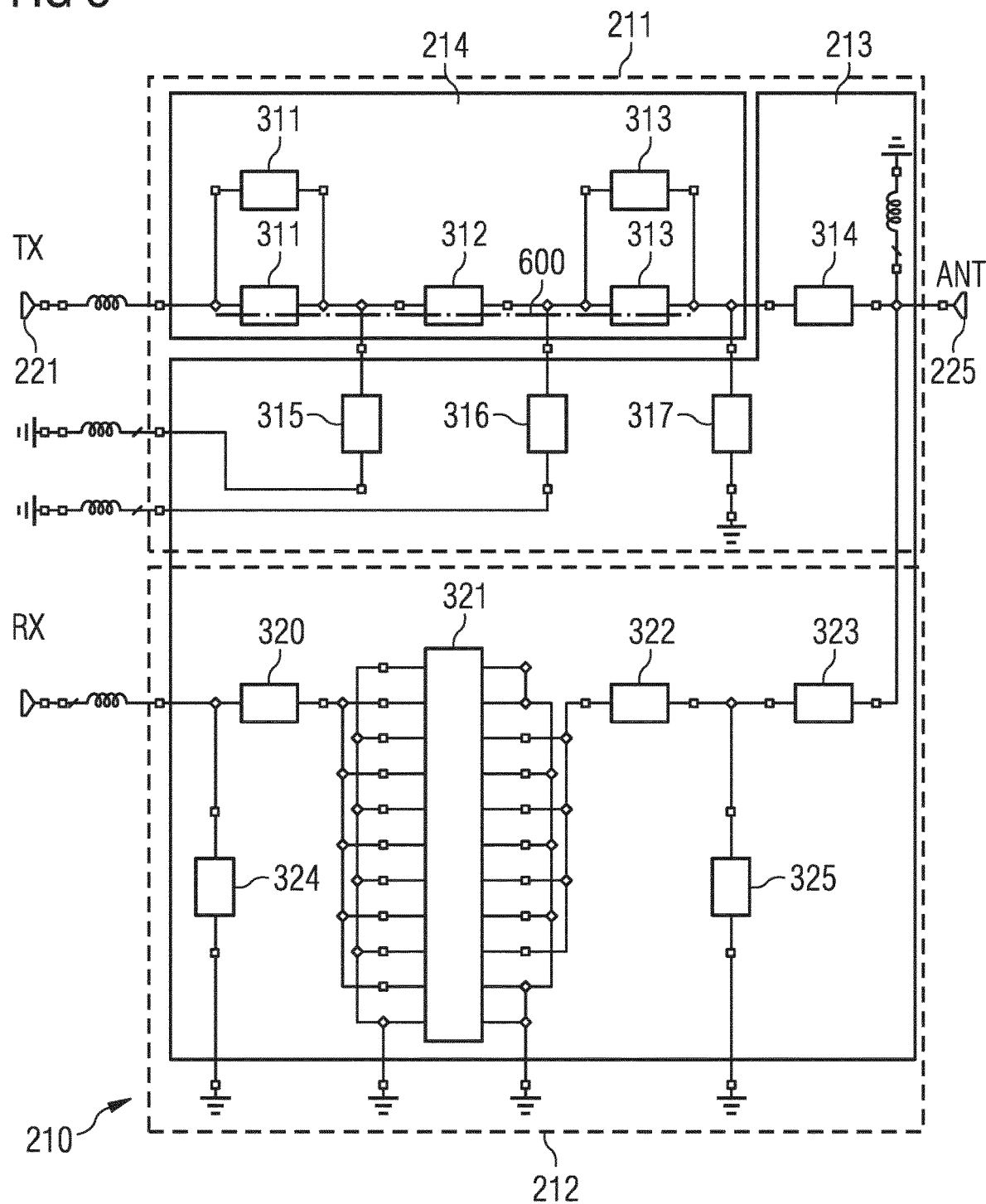
FIG. 3 shows a detailed schematic diagram of a duplexer according to the principles of the present disclosure.
Figure 4:
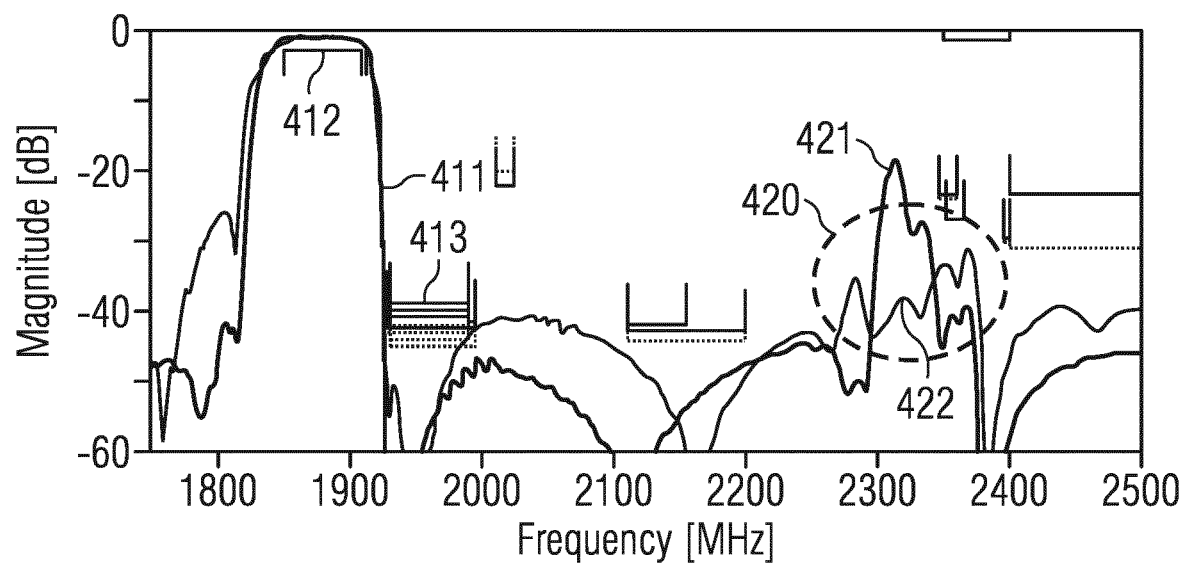
FIG. 4 shows an admittance diagram and the reflection coefficient diagram of a conventional duplexer of FIG. 1 and of the duplexer of FIG. 3 according to the principles of the present disclosure.
Figure 4:
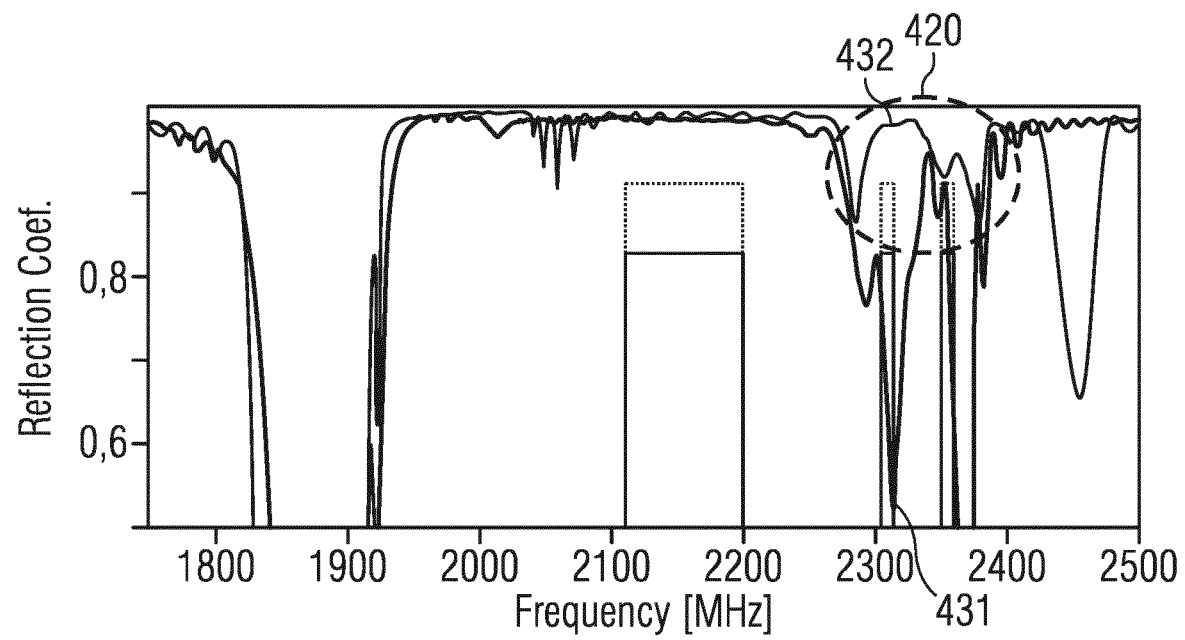

Turning now to FIGS. 3 and 4, a detailed schematic diagram of the realization of the duplexer 210 of FIG. 2 is depicted (FIG. 3) in connection with the electrical behaviour according to admittance and reflection coefficient curves obtained by circuit simulation (FIG. 4). Corresponding curves are depicted for the conventional duplexer 110 of FIG. 1 and the duplexer 210 of FIG. 2 according to the present disclosure.

The first chip 214 comprises series connected resonators 311, 312, 313 which are coupled to Tx port 221. Resonator 311 is directly coupled to Tx port 221, resonators 312, 313 are coupled downstream of resonator 311. The second chip 213 comprises series connected resonators of the Rx path such as resonators 320, 321, 322, 323 and parallel connected resonators of the Rx path such as resonators 324, 325. Chip 213 furthermore comprises the resonator 314 of the Tx path which is coupled to the antenna port 225 and downstream of series resonator 313. Chip 213 furthermore comprises the resonators 315, 316, 317 which are the parallel connected resonators of Tx filter 211. For example, resonator 317 is connected between the node between resonators 313 and 314 and ground potential. In a similar way, resonators 315, 316 are connected between a node in the series paths of Tx filter 211 and ground potential.

The series connected resonators 311, 312, 313 coupled to the Tx input port 221 or downstream thereof receive considerable input power so that they must be configured as power durable. They also form the right skirt 411 of the passband 410 of the filter. The right skirt must be as steep as possible to allow a good transmission within the wanted signal band 212 and achieve high attenuation at the adjacent not-wanted signal band 413. In order to achieve high power durability it is useful to realize resonators having a low temperature coefficient so that the heating of the resonators by the transmission of the RF signal does not significantly shift the right skirt of the passband. In order to achieve a defined right skirt of the passband it is useful to realize resonators having a relatively small distance between poles and zero positions of the admittance characteristics of the resonators.

The layer stack that realizes the resonators 311, 312, 313 is configured to achieve the above-mentioned characteristics. Primarily, this requires a relatively thick dielectric layer that covers the metal electrodes of the interdigital transducers (IDTs) of the SAW resonators. A thick dielectric layer may be a silicon dioxide layer covering the IDTs having a thickness in the range of about 800 nm. By realizing the resonators 311, 312, 313 on the single chip 214, the layer stacks of these resonators including the relatively thick silicon dioxide layer can be optimized for these resonators. The layer stack characteristics are limited to these resonators because a thick silicon dioxide layer may not be useful for other resonators in the duplexer that are responsible for other functions of the filter. In this regard, the parallel connected resonators 315, 316, 317 of the Tx filter 211 receive less power than the series connected resonators 311, 312, 313.

Furthermore, the parallel resonators are not responsible for a steep skirt so that it is not necessary that resonators 315, 316, 317 have a low temperature coefficient. Instead, resonators 315, 316, 317 are responsible for providing sufficient bandwidth for the passband of the filter. It is useful not to include parallel connected resonators 315, 316, 317 on chip 214 as the parallel connected resonators must fulfill different requirements when compared to series connected resonators 311, 312, 313.

The parallel connected resonators 315, 316, 317 and furthermore the series connected resonator 314 coupled directly to the antenna node 225 are realized on a second chip 213, different from chip 214. Furthermore, the Rx filter of resonators 320, ..., 325 is also disposed on the second chip 213. This means that resonators from two filters, Tx filter 211 and Rx filter 212, are disposed on one single die or chip 213. The layer stack of resonators 314, ..., 325 meets different requirements than the layer stack of resonators 311, ..., 313 so that the layer stack of the second chip 213 is optimized to have a low plate mode and a high reflection in the counter band frequencies outside the passband of the filter. In order to achieve this effect, the dielectric layer covering the IDTs of the resonators 314, ..., 325 is considerably thinner than the dielectric cover layer of the resonators of chip 214. For example, a silicon dioxide layer on the resonators of chip 213 has a thickness of about 400 nm, which is half of the thickness of the dielectric layer covering the IDTs of chip 214. A thin dielectric layer reduces the plate mode of the resonators in that it is avoided that acoustical energy couples into the dielectric layer. Furthermore, the reflection in the counter band frequencies is increased.

Turning now to FIG. 4, the effect on the plate mode can be gathered in area 420 of the attenuation curve shown in the upper portion of FIG. 4. In area 420 the attenuation curve has a local maximum. Curve 421 represents the attenuation curve of the conventional duplexer 110 of FIG. 1, and curve 422 depicts the attenuation for the duplexer 210 according to the principles of this disclosure. As can be gathered from FIG. 4, the attenuation of curve 422 in area 420 is lower than conventional curve 421. This is achieved primarily in that resonator 314 coupled to antenna port 225 is realized on the second chip 213 which is optimized in that it has a low thickness of the dielectric silicon dioxide layer covering the IDTs. As a consequence, the plate mode in frequency area 420 is reduced.

As concerns the reflection coefficient in the same frequency area 420 shown in the lower portion of FIG. 4, it is to be noted that the conventional duplexer 110 exhibits curve 431 which shows a local minimum in frequency area 420. In contrast thereto, the reflection curve 432 of duplexer 210 according to the present disclosure exhibits a relatively high level. The enhanced reflection is also achieved in that resonator 314 is disposed on chip 213 which has a silicon dioxide layer of small thickness in the range of about 400 nm so as to increase the reflection behaviour in counter band frequency regions.

Figure 5:
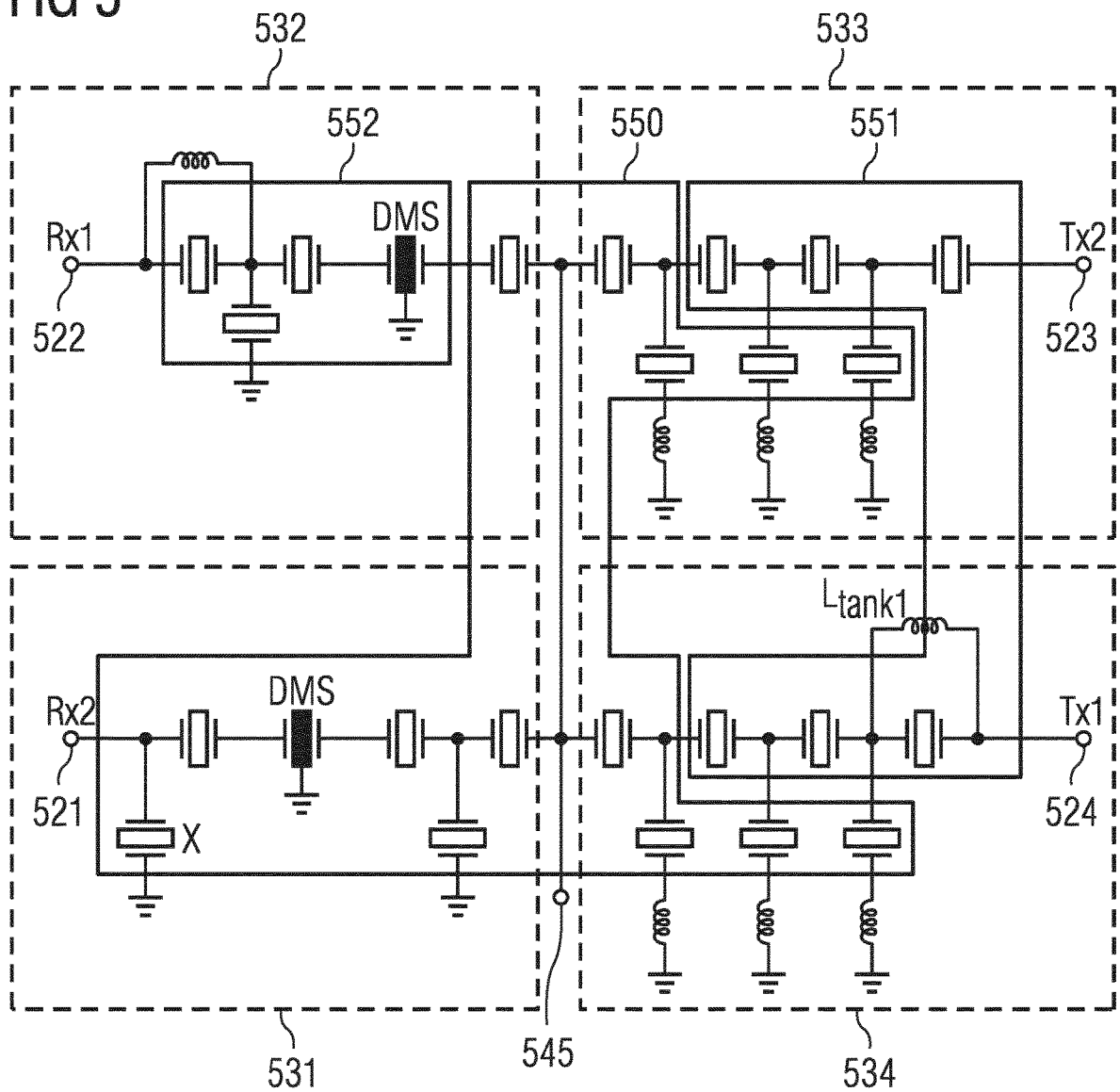
FIG. 5 shows a detailed schematic diagram of a quadplexer according to the principles of the present disclosure.

Turning now to FIG. 5, the schematic diagram of a quadplexer according to the principles of the present disclosure is depicted. The quadplexer comprises an antenna port 545, two Rx ports 521, 522, and two Tx ports 523, 524.

The resonators in the quadplexer realize four filters such as Rx filters 531, 532, and Tx filters 533, 534. The resonators are realized on three chips 550, 551, 552. Chips 550 and 551 comprise resonators from several filters. Chip 550 comprises resonators from all Rx and Tx filters. Specifically, at least the resonators coupled to the antenna port 545 are disposed on chip 550. Chip 551 comprises resonators from the two Tx filters 533, 534. Specifically, chip 551 comprises the resonators that are series connected and that are coupled to the Tx input ports 523, 524 of the Tx filters 533, 534. Chip 552 comprises the remainder of resonators of Rx filter 532. Chip 550 comprises also the parallel connected resonators of the Tx filters 533, 534 and the Rx filter 531. The series resonators of the Tx filters 533, 534 form a steep right filter skirt and must be able to handle sufficient power so that they are realized together on the common chip 551 which is optimized for high power handling and low temperature coefficient. The resonators coupled to the antenna of all four filters are realized on chip 550 which is optimized for a low plate mode and a comparably high reflection in counter bands. The resonators of chip 552 have relaxed requirements so that they can be dedicated to a separate chip. The size of the overall circuit of the quadplexer is not larger than for the conventional design. On the other hand, the functional allocation of resonators of different filters to one common chip enables the layer stack of the resonators to be optimized for the specific function of the corresponding resonator so that the overall filter performance including power handling capability and temperature stability is increased as previously explained in connection with the admittance and reflection curves of FIG. 4.

Figure 6:
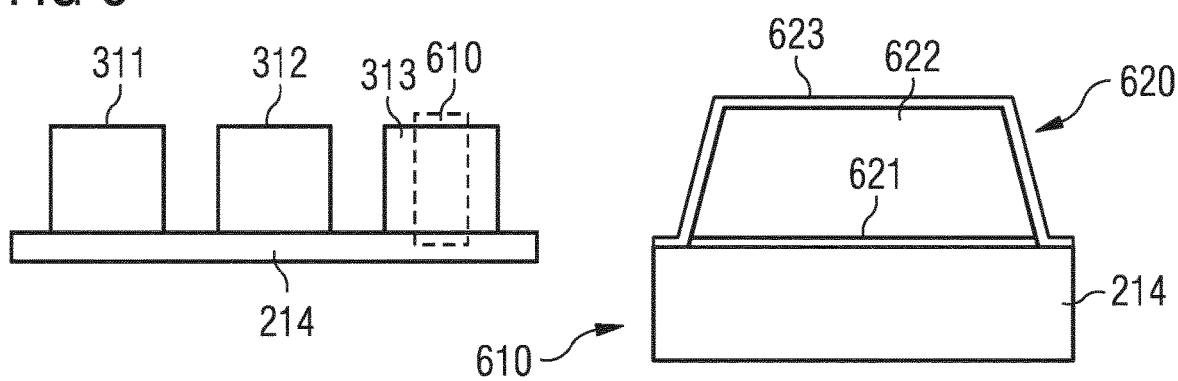
FIG. 6 shows a cross-sectional diagram of a portion of a die showing several resonators and an enhanced cross-section of a portion of a SAW resonator.

Turning now to FIG. 6, a cross-section through a chip including three resonators is depicted. Specifically, FIG. 6 shows a cross-section through chip 214 of FIG. 3 along line 600. Depicted in FIG. 6 is a cross-sectional view of resonators 311, 312, 313 and substrate or chip 214. A portion 610 of the rightmost resonator 313 is shown in enlarged representation at the right-hand side of FIG. 6. The substrate 214 may be a monocrystalline piezoelectric substrate such as lithium niobate or lithium tantalate. Disposed on substrate 214 is a portion of an interdigital transducer (IDT) 620. The electrode structure of the IDT comprises a lowermost layer 621 which may be a titanium seed layer to enable adhesion of the above-disposed metal electrode 622. Metal electrode 622 comprises a composition of copper and aluminum. The IDT is covered by a silicon dioxide layer 623. A trade-off between power durability and low temperature coefficient of the resonator versus high counter band reflection and low plate mode can be achieved by selecting an appropriate thickness of the silicon dioxide layer 622. A higher thickness of layer 622 allows low temperature coefficient and high power durability while a thinner layer 622 provides for low plate mode and high reflection in counter band frequencies. Accordingly, the resonators coupled to the Tx input terminals are disposed on a chip that has a thick silicon dioxide layer, e.g. about 800 nm. A thin layer of silicon nitride (not shown in FIG. 6) of about 100 nm thickness may be useful as a passivation layer covering the silicon dioxide layer. The resonators coupled to the antenna port are disposed on a chip that is manufactured with a relatively thin silicon dioxide layer, e.g. about 400 nm.

The present disclosure is also useful to realize filters with bulk acoustic wave (BAW) resonators. BAW resonators are disposed on a monocrystalline substrate such as a monocrystalline silicon substrate. The resonators comprise a piezoelectric substrate such as aluminum nitride which is sandwiched between top and bottom electrodes. A reflection element such as a Bragg mirror can be disposed between the bottom electrode and the monocrystalline substrate. The teachings set forth above in connection with SAW resonators correspondingly apply to BAW resonators. In particular, the BAW resonators disposed on one single chip or substrate exhibit the same layer stack and the same thicknesses of the layers in the layer stack including the above-disposed dielectric layer such as silicon dioxide. According to the present disclosure, the layer stack is optimized for different purposes such as high power durability and low temperature coefficient or high counter band reflection and low plate mode.

It will be apparent to those skilled in the art that various modifications and variations can be made without departing from the spirit or scope of the disclosure as laid down in the appended claims. Since modifications, combinations, subcombinations and variations of the disclosed embodiments incorporating the spirt and substance of the disclosure may occur to the persons skilled in the art, the disclosure should be construed to include everything within the scope of the appended claims.

The invention claimed is:

1. A radio frequency multiplexer, comprising:
   a send circuit and a receive circuit, each comprising a filter circuit;
   a first port to be coupled to an antenna, the send circuit and the receive circuit coupled to the first port;
   a second port coupled to the send circuit;
   a third port coupled to the receive circuit; and
   a portion of the send circuit and a portion of the receive circuit disposed on a single monocrystalline substrate of a same die, wherein:
      the send and receive circuits each comprises a multitude of resonators, at least one resonator of the send circuit and at least one resonator of the receive circuit being disposed on the single monocrystalline substrate; and
      the send circuit comprises additional resonators disposed on another monocrystalline substrate separated from the single monocrystalline substrate.

2. The radio frequency multiplexer of claim 1, wherein the send circuit comprises a resonator coupled to the first port and the receive circuit comprises a resonator coupled to the first port, wherein the resonators of the send and receive circuits coupled to the first port are disposed on the same single monocrystalline substrate.

3. The radio frequency multiplexer of claim 1, wherein the send circuit comprises a series path that includes the at least one resonator of the send circuit and the receive circuit comprises a series path that includes the at least one resonator of the receive circuit.

4. The radio frequency multiplexer of claim 3, wherein the send circuit comprises at least one parallel path connected to the series path and the at least one parallel path includes a resonator, wherein the resonator of the at least one parallel path of the send circuit is disposed on the single monocrystalline substrate.

5. The radio frequency multiplexer of claim 1, wherein the additional resonators of the send circuit disposed on the other monocrystalline substrate are included in a series path of the send circuit and are configured to exhibit a temperature coefficient that is lower than the temperature coefficient of the resonators disposed on the single monocrystalline substrate.

6. The radio frequency multiplexer of claim 1, wherein the filter circuit of the send circuit exhibits a passband and wherein the at least one resonator of the send circuit disposed on the single monocrystalline substrate is configured such that the filter circuit of the send circuit exhibits a high reflexion in a counter band outside the passband.

7. The radio frequency multiplexer of claim 3, further comprising another send circuit and a fourth port connected to the other send circuit, the other send circuit comprising a series path that includes at least one resonator, wherein the at least one resonator of the send circuit and the at least one resonator of the other send circuit are coupled to different ones of the second and fourth ports.

8. The radio frequency multiplexer of claim 1, wherein the resonators include a stack of layers disposed on the single monocrystalline substrate, wherein a thicknesses of the layers are the same within different ones of the resonators disposed on the single monocrystalline substrate.

9. The radio frequency multiplexer of claim 1, wherein the resonators are surface acoustic wave resonators comprising an electrode including layers of different metals disposed on the single monocrystalline substrate and a dielectric layer covering the layers of different metals, wherein thicknesses of the layers of different metals and a thickness of the dielectric layer of the resonators disposed on the single monocrystalline substrate are the same within different resonators.

10. The radio frequency multiplexer of claim 9, wherein the dielectric layer is a layer of silicon dioxide.

11. The radio frequency multiplexer of claim 1, wherein the resonators are surface acoustic wave resonators comprising a metal electrode covered by a dielectric layer, wherein a thicknesses of the dielectric layer of the resonators disposed on the single monocrystalline substrate and of the dielectric layer of the resonators disposed on the other monocrystalline substrate are substantially different.

12. The radio frequency multiplexer of claim 1, wherein the resonators are bulk acoustic wave resonators comprising a piezoelectric layer sandwiched between electrodes disposed on the single monocrystalline substrate, wherein a thicknesses of layers of the bulk acoustic wave resonators disposed on the single monocrystalline substrate are the same within different resonators.

13. The radio frequency multiplexer of claim 9, wherein the dielectric layer is a layer of silicon dioxide and the single monocrystalline substrate is a monocrystalline piezoelectric substrate or a monocrystalline silicon substrate.

* * * * *